United States Patent
Borland et al.

(10) Patent No.: US 8,921,963 B2
(45) Date of Patent: Dec. 30, 2014

(54) PHOTOVOLTAIC DEVICES WITH BASE METAL BUSS BARS

(71) Applicant: E I du Pont de Nemours and Company, Wilmington, DE (US)

(72) Inventors: William J Borland, Chapel Hill, NC (US); Alan Frederick Carroll, Raleigh, NC (US); Barry Edward Taylor, Raleigh, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 14/191,880

(22) Filed: Feb. 27, 2014

(65) Prior Publication Data

US 2014/0174527 A1 Jun. 26, 2014

Related U.S. Application Data

(62) Division of application No. 13/082,441, filed on Apr. 8, 2011, now Pat. No. 8,697,476.

(60) Provisional application No. 61/329,574, filed on Apr. 30, 2010.

(51) Int. Cl.
*H01L 27/14* (2006.01)
*H01L 31/18* (2006.01)
*H01L 31/0224* (2006.01)
*H01L 31/02* (2006.01)
*H01L 31/0216* (2014.01)

(52) U.S. Cl.
CPC .......... *H01L 31/02021* (2013.01); *H01L 31/18* (2013.01); *H01L 31/022425* (2013.01); *Y02E 10/50* (2013.01); *H01L 31/02168* (2013.01)
USPC ........................................................ 257/431

(58) Field of Classification Search
None
See application file for complete search history.

(56) References Cited

U.S. PATENT DOCUMENTS

| | | | |
|---|---|---|---|
| 4,737,197 A | 4/1988 | Nagahara et al. | |
| 5,178,685 A | 1/1993 | Borenstein et al. | |
| 5,279,682 A * | 1/1994 | Wald et al. ............. | 136/256 |
| 5,320,684 A | 6/1994 | Amick et al. | |
| 2004/0200522 A1 | 10/2004 | Fukawa et al. | |
| 2010/0096014 A1 * | 4/2010 | Iida et al. ............. | 136/265 |

* cited by examiner

*Primary Examiner* — Scott B Geyer

(57) ABSTRACT

A photovoltaic cell such as a solar cell is disclosed. The cell comprises (a) a semiconductor substrate having a front surface, (b) one or more anti-reflection coating layers on the front surface of the semiconductor substrate, (c) a plurality of silver-containing fingers in contact with the one or more anti-reflection coating layers and in electrical contact with the semiconductor substrate; and (d) one or more base metal containing buss bars each in contact with the one or more anti-reflection coating layers and the silver-containing fingers. The base metal may be selected from one or more of copper, nickel, lead, tin, iron, indium, zinc, bismuth and cobalt. Methods for making photovoltaic cells with base metal containing buss bars are also disclosed.

4 Claims, 4 Drawing Sheets

US 8,921,963 B2

PHOTOVOLTAIC DEVICES WITH BASE METAL BUSS BARS

CROSS REFERENCE TO RELATED APPLICATIONS

This application is a division application of U.S. patent application Ser. No. 13/082,441 filed Apr. 8, 2011, which claims the benefit of U.S. Provisional Application No. 61/329,574, filed Apr. 30, 2010.

FIELD OF THE INVENTION

This invention provides processes and thick-film compositions to form conductive fingers and metal buss bars for the electrodes of a photovoltaic cell device.

BACKGROUND OF THE INVENTION

Conventional crystalline silicon photovoltaic cells, such as solar cells, are generally made of thin wafers of silicon (Si) in which a rectifying or p-n junction has been created and electrode contacts, that are electrically conductive, have been subsequently formed on both sides of the wafer. A solar cell structure with a p-type silicon substrate has a positive electrode contact on the base or backside and a negative electrode contact on the n-type silicon or emitter that is the front-side or sun-illuminated side of the cell. The "emitter" is a layer of silicon that is doped in order to create the rectifying or p-n junction and is thin in comparison to the p-type silicon substrate. Radiation of an appropriate wavelength falling on a p-n junction of the silicon semiconductor substrate serves as a source of external energy to generate hole-electron pairs in the semiconductor substrate. Due to the potential difference which exists at a p-n junction, holes and electrons move across the junction in opposite directions. The electrons move to the negative electrode contact, and the holes move to positive electrode contact, thereby giving rise to flow of an electric current that is capable of delivering power to an external circuit.

Most crystalline silicon solar cells are fabricated with an anti-reflection insulating layer comprising silicon nitride, silicon dioxide, titanium dioxide or other materials with a similar refractive index. This layer acts as the anti-reflection coating (ARC) on the front-side of the cell to maximize sunlight absorption. Front-side electrode contacts are generally made by screen printing conductive fingers and buss bars using a thick-film silver conductive paste on the anti-reflection coating followed by firing at an elevated temperature. Conventional front electrode thick-film silver pastes contain silver powder, an organic medium, a solvent, a glass frit and may contain various additives. The silver powder functions as the main electrode contact material and provides for low resistance. The glass frit may contain lead or other low melting point constituants to give a softening point of about 300 to 600° C. so that during firing, the glass frit becomes molten and functions as the "fire through" or "etching" agent wherein the silicon nitride anti-reflection coating is penetrated by the paste to allow the silver to make electrical contact to the n-type silicon. The glass frit also provides for adhesion of the silver to the silicon. Compositions and firing profiles of the thick-film silver conductive paste are optimized to maximize cell efficiency.

FIG. 1 is a process flow diagram, shown in partial cross section, illustrating the fabrication of a photovoltaic device according to conventional processes and with conventional materials.

In FIG. 1A, a p-type silicon substrate 10 is provided. The substrate may be composed of single-crystal silicon or of multicrystalline silicon. As shown in FIG. 1B, in the case of a p-type substrate, an n-type silicon layer 20 is formed to create a p-n junction. The n-type layer is typically formed by the thermal diffusion of a donor dopant, preferably phosphorus (P) using phosphorus oxychloride ($POCl_3$). The depth of the diffusion layer is generally about 0.3 to 0.5 micrometers ($\mu$m). The phosphorus doping causes the surface resistance of the silicon to be reduced to between several tens of ohms per square ($\Omega/\square$) to something less than 100 ohms per square ($\Omega/\square$). In the absence of any particular modification, the diffusion layer 20 is formed over the entire surface of the silicon substrate 10.

Next, one surface of the diffusion layer 20 is protected with a resist or the like (not shown) and the diffusion layer is removed from all but one surface of the article of FIG. 1B by etching. The resist is removed, leaving the article of FIG. 1C.

Next, as shown in FIG. 1D, an insulating layer of silicon nitride SiNx:H film is formed on the above-described n-type diffusion layer to form an anti-reflection coating (ARC). The thickness of the SiNx:H anti-reflection coating 30 is about 700 to 900 Å. As an alternative to silicon nitride, silicon oxide or titanium oxide may be used as the ARC.

As shown in FIG. 1E, a silver paste 50 for the front electrode is screen printed and then dried over the silicon nitride ARC 30. In FIG. 1E only two front electrode fingers are shown for purposes of clarity and simplicity. In practice, many are printed. In addition, an aluminum paste 60 and a backside silver or silver/aluminum paste 70 are screen printed and successively dried on the backside of the substrate. Co-firing of front and backside pastes is then carried out in an infrared furnace at a temperature range of approximately 700° C. to 975° C. in air for a period of from several seconds to several tens of minutes.

As shown in FIG. 1F, aluminum diffuses from the aluminum paste into the silicon substrate 10 as a dopant during firing, forming a p+ layer 40 containing a high concentration of aluminum dopant. This layer is generally called the back surface field (BSF) layer, and helps to improve the energy conversion efficiency of the photovoltaic cell.

Firing also converts the aluminum paste 60 to an aluminum back electrode 61. The backside silver or silver/aluminum paste 70 is fired at the same time, becoming a silver or silver/aluminum back electrode 71. During firing, the boundary between the back side aluminum and the back side silver or silver/aluminum assumes an alloy state, thereby achieving electrical connection. The aluminum electrode accounts for most of the back, owing in part to the need to form a p+ layer 40. Because soldering to an aluminum electrode is impossible, a silver back tab electrode is formed over portions of the back side as an electrode for interconnecting photovoltaic cells by means of a copper ribbon or the like.

During the co-firing, the front electrode-forming silver paste 50 sinters and penetrates through the ARC 30, and is thereby able to electrically contact the n-type layer 20. This type of process is generally called "fire through" or "etching" of the silicon nitride ARC. This fired through state is apparent in layer 51 of FIG. 1F.

FIG. 2 schematically illustrates a conventional front electrode design for a silicon solar cell 200 in plan view and as partially shown in cross section in FIG. 1F. The solar cell anti-reflection coating is shown as element 230 in FIG. 2 and is represented as element 30 in FIG. 1F. Numerous silver-containing fingers 251 of the front electrode design are arranged over the area of the solar cell. Fingers 251 are represented by the element 51 in FIG. 1F. In FIG. 2, only 28 fingers 251 are shown for clarity. However, the number of fingers may be much higher in a typical 6 inch by 6 inch crystalline silicon solar cell. The number of fingers 251 are designed to maximize the extraction of electric current from the solar cell and depends on the width of the fingers. A typical width of fingers 251 may be 100 micrometers and a typical number of fingers 251 on a 6 inch by 6 inch solar cell may be 60. Other widths and numbers of fingers 251 are feasible. Buss bars 280 contact the fingers 251 and are arranged perpendicular to the fingers 251. The buss bars serve to conduct and carry current from the fingers 251 to external circuitry. Designs with two buss bars are common but other designs are feasible. The width of a typical buss bar is approximately 2 mm. In conventional cell fabrication, fingers 251 and buss bars 280 are printed at the same time with silver thick-film paste. Using the same type of thick-film silver paste for the fingers and buss bars has allowed for the firing of the conductive fingers and bus bars in a single firing with a single set of firing conditions such as temperature and firing atmosphere. The use of the same or similar thick-film silver paste for the fingers and the buss bars has been considered necessary to minimize the number of firings and to minimize cell damage associated with multiple high temperature firings. A larger number of firings is more likely to reduce the efficiency of the solar cell.

There is a need for greater flexibility in the conductive pastes used for forming the buss bars for the sun-facing side of solar cells. High silver costs and limited supply of silver make it important to be able to form buss bars for the sun-facing side of solar cells from less expensive and more available conductors. Novel compositions and processes for forming front side buss bars of photovoltaic devices are needed, which make possible the reduced use of silver pastes.

SUMMARY OF THE INVENTION

A method for making a photovoltaic device, such as a solar cell, is provided. The method comprises (a) providing a silicon substrate, (b) forming an anti-reflection coating on the silicon substrate, (c) applying a silver-containing thick-film paste on the anti-reflection coating so as to form fingers of the silver-containing thick-film paste on at least a portion of the anti-reflection coating, (d) firing the fingers of the silver-containing thick-film paste to form silver-containing fingers that fire through the anti-reflection coating and contact the silicon substrate, and (e) forming one or more base metal buss bars on at least a portion of the anti-reflection coating and the silver-containing fingers. The step of forming base metal buss bars on at least a portion of the anti-reflection coating and silver-containing fingers may comprise the steps of (a) applying a thick-film paste containing base metal particles onto a portion of the anti-reflection coating and silver-containing fingers, and (b) firing the thick-film paste containing base metal particles at a temperature that is less than or equal to the temperature at which the silver-containing thick film is fired. The firing of the silver-containing thick film paste may be conducted at a first firing temperature and the firing of the thick-film paste containing base metal particles may be conducted at a second firing temperature where the firing of the thick-film paste containing base metal particles is conducted separate from and after the firing of the silver-containing paste, and where the second firing temperature is lower than the first firing temperature.

The silver-containing paste is preferably fired in air at a temperature in the range of 600° C. to 975° C., and the thick-film paste containing base metal particles is preferably fired at a temperature in the range of 300° C. to 600° C. The thick-film paste containing base metal particles is preferably fired in an atmosphere having a partial pressure of oxygen of less than $10^{-4}$ atmospheres, and preferably in a nitrogen atmosphere.

In one disclosed embodiment, the silver-containing thick-film paste and the thick-film paste containing base metal particles are fired at the same time in an oxygen-containing atmosphere, and during the firing the base metal particles of the thick-film paste are protected with a flux. In another disclosed embodiment, the step of forming base metal buss bars onto at least a portion of the anti-reflection coating and silver-containing fingers comprises the steps of (a) applying a thick-film paste containing base metal particles onto a portion of the anti-reflection coating and silver-congaing fingers, and (b) curing the thick-film paste containing base metal particles at a temperature in the range of 125° C. to 250° C.

A disclosed thick-film paste containing base metal particles is comprised of 60 to 95 wt % base metal particles, 0 to 10 wt % glass frit, and 4 to 40 wt % organic medium. The base metal particles may be comprised of copper, nickel, lead, tin, iron, indium, zinc, cobalt, bismuth or combinations thereof. The thick-film paste containing base metal particles is preferably formed into the shape of base metal buss bars on at least a portion of the anti-reflection coating and the silver-containing fingers by screen printing. Alternatively, the base metal buss bars may be formed by plating, extrusion, sputtering, evaporation or inkjet processes.

A photovoltaic cell is also disclosed. The cell comprises (a) a semiconductor substrate having a front surface, (b) one or more anti-reflection coating layers on the front surface of the semiconductor substrate, (c) a plurality of silver-containing fingers in contact with the one or more anti-reflection coating layers and in electrical contact with the semiconductor substrate; and (d) one or more buss bars each in contact with the one or more anti-reflection coating layers and the silver-containing fingers, where the buss bars contain a base metal. The base metal is preferably selected from one or more of copper, nickel, lead, tin, iron, indium, zinc, bismuth and cobalt, and is more preferably copper. In a disclosed embodiment, at least 80 wt % of the metal in the buss bars is a base metal, and more preferably at least 95 wt % of the metal in the buss bars is a base metal. The buss bars in contact with the one or more anti-reflection layers are preferably not in electrical contact with the semiconductor substrate.

Figure 1A:
FIGS. 1A-1F make up a process flow diagram, shown in partial cross section, illustrating the fabrication of a semiconductor device according to conventional processes and with conventional materials.
Figure 1B:
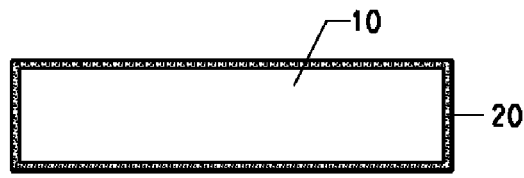
Figure 1C:

The various features of the drawings discussed below are not necessarily drawn to scale. Dimensions of various features and elements in the drawings may be expanded or reduced to more clearly illustrate the embodiments of the invention.

DETAILED DESCRIPTION OF THE INVENTION

The detailed description discusses the inventions recited in the claims with reference to the following defined terms:

As used herein, the term "front-side electrode" refers to the combination of the conductive fingers and the buss bars that are connected to the sun-facing side of a solar cell.

As used herein, the term "base metal" refers to a metal that will oxidize when subjected to an elevated temperature in an oxygen containing atmosphere, such as air.

As used herein, the term "floating buss bar" refers to the buss bar element of the front electrode design that has not fired through the anti-reflection coating on the silicon substrate. As such, a floating bus bar does not make electrical contact with an underlying n-type silicon in a photovoltaic cell.

As used herein, the terms "insulating layer", "anti-reflection coating" and "ARC" are interchangable.

As used herein, the term "thick-film paste" refers to dispersions of conductive metal particles and glass frit in an organic medium having a suitable consistency and rheology for printing. Thick-film pastes may also include thixotropes, surfactant and other inorganic components. The organic medium is a fugitive material, in that it is burnt off during the initial stages of the firing process.

Photovoltaic devices having base metal buss bars are disclosed. Also disclosed are methods for making photovoltaic devices having base metal buss bars. Thick-film compositions for producing a photovoltaic cell with base metal buss bars also disclosed. The disclosed photovoltaic devices are solar cells but they may also be other photovoltaic devices having electrode contacts to n-type silicon such as photodetectors or light emitting diodes. The disclosed embodiment is a solar cell with a front face electrode having a floating base metal buss bar.

Figure 1D:
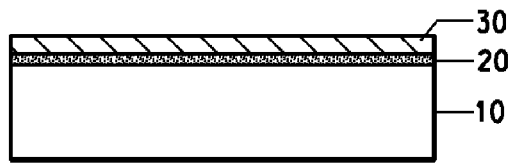
Figure 1E:
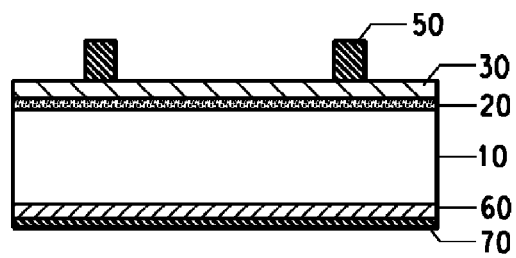
Figure 1F:
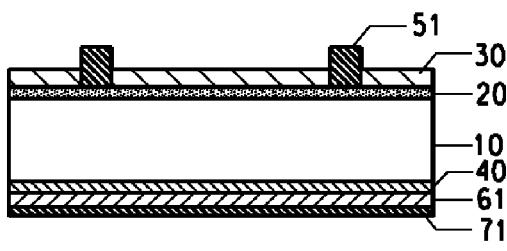
Figure 2:
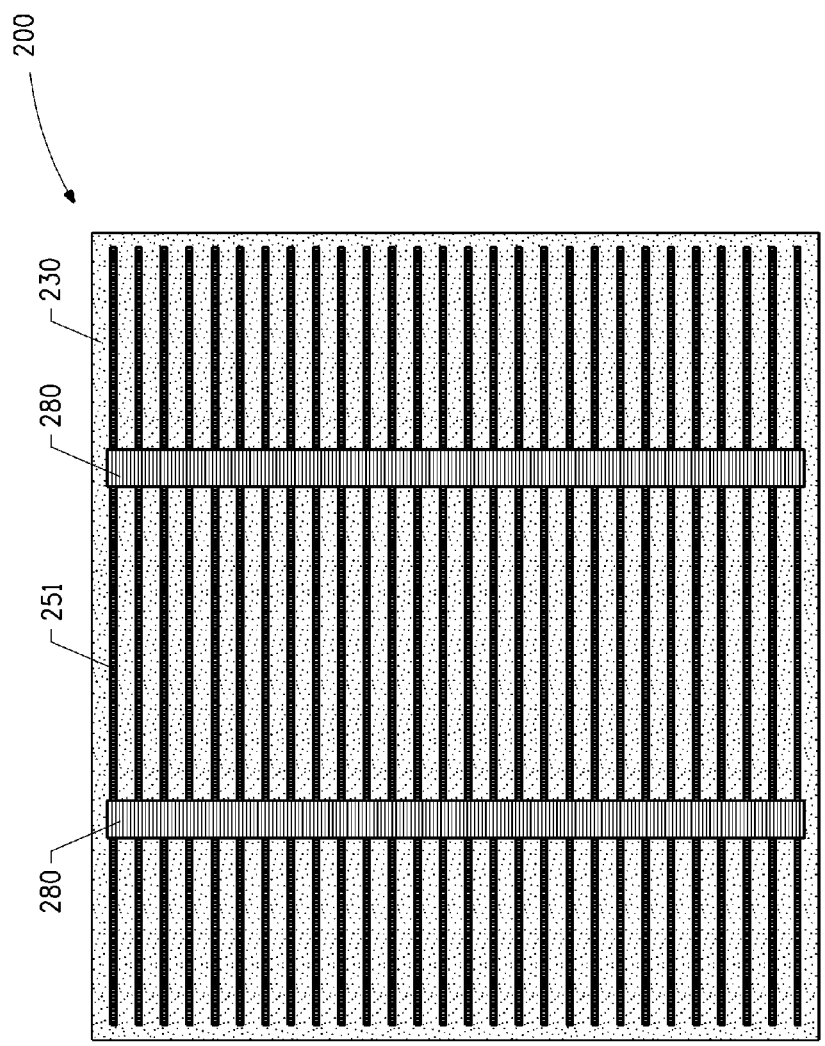
FIG. 2 is a schematic front plan view of the front, sun-facing side of a solar cell of conventional design.

FIG. 3 schematically illustrates a method for fabricating a silicon solar cell with base metal buss bars. With reference to FIG. 1, the article of FIG. 1D is provided and represented in FIG. 3 as FIG. 3A. In FIG. 3A, antireflection coating 330 is formed over n-type silicon diffusion layer 320 which is formed over the p-type silicon substrate 310. The p-type silicon substrate may be single-crystal silicon or multicrystalline silicon as described with respect to FIG. 1A. An n-type silicon layer 320 is formed to create a p-n junction as described with respect to FIG. 1B. The ARC 330 is preferably an insulating layer of silicon nitride SiNx:H. The thickness of the ARC is about 700 to 900 Å. The ARC may alternatively be comprised of silicon dioxide, titanium dioxide, or other materials with a similar refractive index. The ARC may also comprise combinations of silicon nitride, silicon dioxide, titanium dioxide and other materials of similar refractive index.

Figure 3A:
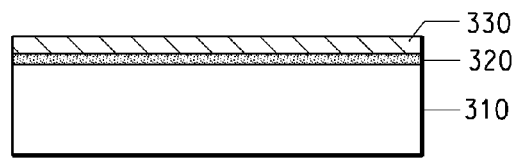
FIGS. 3A-3D show, in partial cross section, a method of fabricating a silicon solar cell according to the present invention.
Figure 3B:
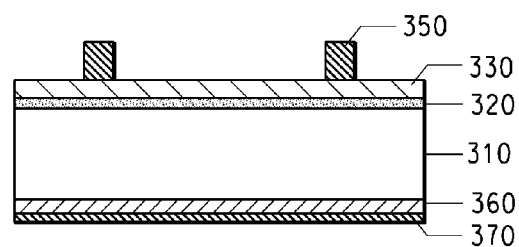
Figure 4:
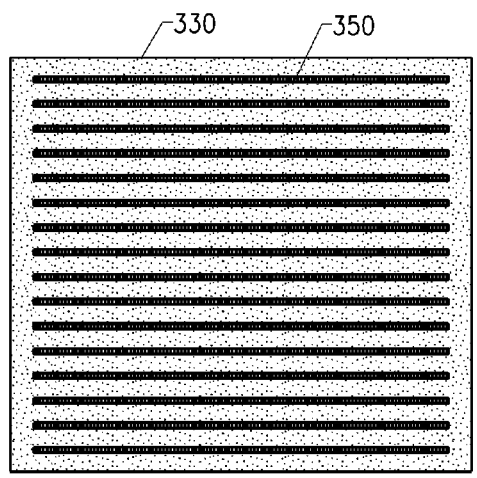
FIG. 4 is a schematic front plan view of a partially formed front, sun-facing front-side of a photovoltaic cell that is also shown in partial cross section in FIG. 3B.

As shown in FIG. 3B and FIG. 4, a silver paste 350 is deposited in a pattern for forming front electrode conductive fingers and then dried over the anitireflection coating 330. Deposition of the silver paste is preferably done by screen printing, but the silver may alternatively be deposited by plating, extrusion, sputtering, evaporation or inkjet processes. In FIG. 3B only two front electrode fingers are shown in cross section for purposes of simplicity and clarity. In practice, many electrode fingers are deposited on the ARC 330.

The silver paste is a thick-film paste comprising conductive silver particles and glass frit in an organic medium having a suitable consistency and rheology for printing. The paste preferably is comprised of 60 to 95 wt % silver metal particles or powder, 1 to 10 wt % glass frit, and 4 to 39 wt % organic medium. This thick-film paste preferably includes thixotropes and surfactant, and may also include other inorganic components. Silver particles or powder and glass frit are mixed with an organic medium by mechanical mixing to form viscous compositions having suitable consistency and rheology for printing. The silver particles have an average diameter in the range of 0.5 to 5 micrometers. A wide variety of inert viscous materials can be used as the organic medium. The organic medium must be one in which the metal powders are dispersible with an adequate degree of stability. The rheological properties of the medium must be such that they lend good application properties to the composition, including: stable dispersion of metal powders; appropriate viscosity and thixotropy for printing; appropriate paste wettability of the substrate; and a good drying rate. The organic vehicle used in the disclosed thick film composition is preferably a nonaqueous inert liquid. Use can be made of any of various organic vehicles, which may or may not contain thickeners, stabilizers and/or other common additives. The organic medium is typically a solution of polymer(s) in solvent(s). Additionally, a small amount of additives, such as surfactants, may be a part of the organic medium.

The most frequently used polymer for the organic medium is ethyl cellulose. Other desirable polymers include rosin and rosin derivatives. Additionally, ethylhydroxyethyl cellulose mixtures of ethyl cellulose and phenolic resins, polymethacrylates of lower alcohols, and monobutyl ether of ethylene glycol monoacetate can also be used. The most widely used solvents found in thick film compositions are ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired.

The polymer present in the organic medium is in the range of 1 wt. % to 11 wt. % of the total organic medium depending on the polymer chosen. The thick-film composition useful in certain embodiments of the invention may be adjusted to a predetermined, screen-printable viscosity with the organic medium. The ratio of organic medium in the thick-film composition to the inorganic components in the dispersion is dependent on the method of applying the paste and the kind of organic medium used, and it can vary. Usually, the dispersion will contain 60-95 wt % of inorganic components (metal powders and glass frit) and 4-40 wt % of organic medium (vehicle) in order to obtain good wetting.

The silver paste preferably includes thixotropes and surfactant, and may also include other inorganic components. Suitable silver pastes for screen printing the front silver-containing conductive fingers are PV159 or PV16A obtainable form E. I. du Pont de Nemours and Company. Other thick-film silver pastes designed for forming front electrodes of photovoltaic cells may also be utilized.

FIG. 4 shows a plan view of the front face of a photovoltaic cell with a thick-film conductive paste deposited in a pattern for forming conductive fingers and as described above with respect to FIG. 3B. In FIG. 4, multiple fingers 350 are shown printed and dried on the front face surface of the ARC 330. The number of fingers may be much higher than that shown in FIG. 4. The number of fingers 350 are designed to maximize the extraction of electric current from the solar cell and depends on the width of the fingers. A typical width of fingers

350 may be about 100 micrometers and a typical number of fingers on a 6 inch by 6 inch solar cell may be 60. Other widths and numbers of fingers are feasible.

Firing of front face silver-containing fingers is next carried out at a temperature range of approximately 600° C. to 975° C. in air for a period of from several seconds to several tens of minutes. More preferably, the firing temperature is in the range of approximately 750° C. to 900° C. Firing may be conducted in an infrared furnace or other firing oven used in the manufacture of photovoltaic cells. During the firing, the front electrode finger-forming silver paste 350 sinters and penetrates through the ARC 330 to form silver-containing conductive fingers 351, such that the conductive fingers electrically contact the n-type silicon layer 320. This type of process is generally called "fire through" or "etching" of the ARC. This fired through state is apparent in FIG. 3C where it is shown that fingers 351 have penetrated the ARC 330 and made contact with the n-type diffusion layer 320.

Figure 3C:
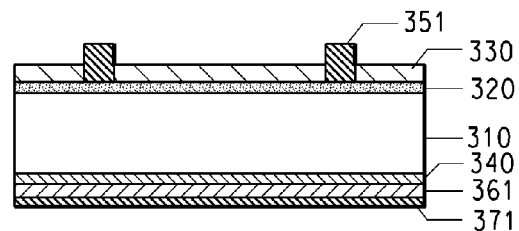
Figure 3D:
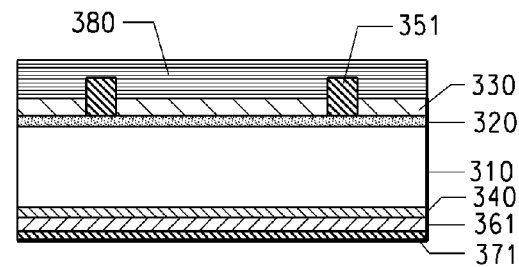

The frontside conductive fingers and backside electrode are preferably fired at the same time. Alternatively, the frontside conductive fingers may be fired independent of the backside electrode. Where the front conductive fingers and the backside electrode are to be fired together, an aluminum paste 360 and a backside silver or silver/aluminum paste 370 may be printed and successively dried on the backside of the substrate prior to firing, as shown in FIG. 3B. The backside pastes are thick-film pastes comprised of metal powder, organic medium, glass frit, and optionally surfactant and thixotropes As shown in FIG. 3C, firing converts aluminum paste 360 to an aluminum back electrode 361. The backside silver or silver/aluminum paste 370 is fired at the same time, becoming a silver or silver/aluminum back electrode 371. Aluminum diffuses from the aluminum paste into the silicon substrate 310 as a dopant during firing, forming a p+ layer 340 containing a high concentration of aluminum dopant. This layer is generally called the back surface field (BSF) layer, and helps to improve the energy conversion efficiency of the solar cell. During firing, the boundary between the back side aluminum and the back side silver or silver/aluminum assumes an alloy state, thereby achieving electrical connection. The aluminum electrode accounts for most of the back, owing in part to the need to form a p+ layer 340. Because soldering to an aluminum electrode is impossible, a silver back tab electrode is formed over portions of the back side as an electrode for interconnecting solar cells by means of a conductor such as a copper ribbon or the like.

Figure 5:
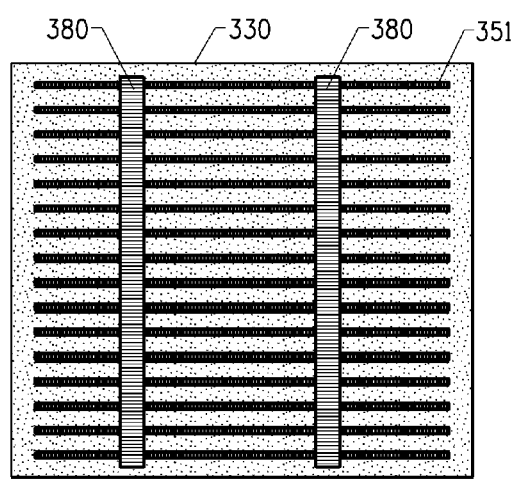
FIG. 5 is a schematic front plan view of the front, sun-facing side of a photovoltaic cell that is also shown in partial cross section in FIG. 3D.

The paste for forming the base metal buss bars is deposited on the silver-containing fingers. As shown in plan view In FIG. 5, base metal buss bars 380 are shown on the fired conductive fingers 351. The base metal buss bars may be screen printed onto the previously fired substrate and fired silver-containing fingers. The buss bars may be screen printed using a thick-film paste comprising conductive base metal particles and glass frit in an organic medium having a suitable consistency and rheology for printing. This paste is comprised of 60 to 95 wt % base metal particles or powder, 0 to 10 wt % glass frit, and 4 to 40 wt % organic medium. This thick-film paste preferably includes thixotropes and surfactant, and may also include other inorganic components. Alternatively, other deposition methods may be used to form the base metal buss bars such as plating, extrusion, sputtering, evaporation or inkjet processes.

The conductive base metal particles of the thick-film particles may comprise particles or powder consisting of copper, nickel, lead, tin, iron, indium, zinc, cobalt, bismuth or combinations thereof. The base metal particles have a preferred particle size of 0.5 to 10 micrometers. The paste may have minor amounts of silver incorporated into it. Preferably, at least 80 wt % of the metal in the base metal buss bars is a base metal, and more preferably at least 95 wt % of the metal in the base metal buss bars is a base metal.

A wide variety of inert viscous materials can be used as the organic medium in the paste for forming the base metal buss bars. The organic medium must be one in which the base metal particles or powders are dispersible with an adequate degree of stability. The rheological properties of the medium must be such that they lend good application properties to the composition, including: stable dispersion of metal powders; appropriate viscosity and thixotropy for screen printing or other deposition method utilized; appropriate paste wettability of the substrate; and a good drying rate. The organic vehicle used in the disclosed thick-film composition is preferably a nonaqueous inert liquid. Use can be made of any of various organic vehicles, which may or may not contain thickeners, stabilizers and/or other common additives. The organic medium is typically a solution of polymer(s) in solvent(s). Additionally, a small amount of additives, such as surfactants, may be a part of the organic medium. The most frequently used polymer for the organic medium is ethyl cellulose. Other desirable polymers include rosin and rosin derivatives. Additionally, ethylhydroxyethyl cellulose mixtures of ethyl cellulose and phenolic resins, polymethacrylates of lower alcohols, and monobutyl ether of ethylene glycol monoacetate can also be used. Solvents for thick-film base metal compositions are preferably ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired.

The polymer present in the organic medium is in the range of 1 to 11 wt. % of the total organic medium depending on the polymer chosen. The thick-film composition useful in certain embodiments of the invention may be adjusted to a predetermined, screen-printable viscosity with the organic medium. The ratio of organic medium in the thick-film paste composition to the inorganic components in the dispersion is dependent on the method of applying the paste and the kind of organic medium used, and it can vary. Usually, the dispersion will contain 60-95 wt % of inorganic components (metal powders and glass fritt) and 4-40 wt % of organic medium (vehicle) in order to obtain good wetting.

The substrate onto which the paste for forming base metal buss bars has been deposited preferably is now fired in an atmosphere containing a gas that is substantially non-oxidizing to the base metal. A firing atmosphere with a partial pressure of oxygen of less than $10^{-4}$ and more preferably less than $10^{-6}$ is substantially non-oxidizing to a base metal. A small amount of oxidation is acceptable so a substantially non-oxidizing atmosphere may be used. Suitable firing atmospheres include nitrogen, argon, carbon monoxide/carbon dioxide mixtures, forming gas or mixtures thereof. A particularly suitable atmosphere for firing the base metal buss bars is nitrogen. The substrate and base metal buss bars are preferably fired at a temperature that is lower than the firing temperature of the silver-containing fingers, such as between 300° C. and 600° C., so that loss of hydrogen passivation that may have been introduced earlier during the ARC (e.g., silicon nitride) coating step is minimized. The lower buss bar firing temperature also helps avoid over firing which would lead to the efficiency of the cell being degraded. The firing of the base metal buss bars may benefit from some underfiring of the silver-containing fingers so that optimum efficiencies are realized after firing of the base metal buss bars. In this instance, firing of the underfired silver-containing fingers is completed during the firing of the base metal buss bars and the silver-containing fingers do not get over fired. During the firing of the buss bars, the base metal buss bars 380 sinter and make electrical contact to the silver-containing fingers 351. As shown in the partial cross section view of FIG. 3D, there is no fire though of the anti-reflection coating 330 by the base metal buss bar paste, which results in a floating buss bar. Because the fire through process requires oxygen, eliminating oxygen from this buss bar firing step means fire through by the buss bars does not occur. Preferably, the width of a fired buss bar is approximately 1 to 3 mm.

An alternative to the use of non-oxidizing atmospheres in the firing of the base metal buss bars is the use of air-firing base metal compositions for buss bars 380. Such compositions are formulated to withstand short periods at elevated temperatures in air without substantial oxidation. These air-firing base metal pastes include fluxes, for example, that coat the metal and scavenge oxygen from the surface of the base metal powders during the firing process. Such compositions include materials like nickel boride, copper and boron, brazing or solder alloys with brazing or solder fluxes and the like. Brazing or solder alloys may have compositions that include metals from the group of lead, silver, zinc, bismuth, tin, indium and zinc and may also include fluxes and low temperature glass frits. The fluxes provide for oxidation protection and the glass frits provide adhesion after firing. The glass frit used in air-firing base metal pastes have a composition designed to not fire through the ARC, such as a composition that does not include lead oxide or bismuth oxide. With air-firing base metal pastes, the separate firing of the buss bar can be dispensed with if the firing of the front face silver-containing fingers 350 can be adjusted enough to accommodate the air firing of the base metal composition. Limiting the time at peak temperature to a few seconds, for example, would be appropriate for some air-firing base metal compositions. In such a case, the fingers 350 are printed and dried followed by printing the air-firing base metal paste. The buss bar paste is dried and the pastes forming the fingers and buss bars together with the pastes applied to the back of the solar cell are cofired in an air environment.

An alternative embodiment to the firing of base metal buss bars is the use of polymer thick film pastes. Such pastes are not fired but simply cured at temperatures in the range of 125° C. to 250° C. to realize their electrical properties. Although such cured base metal polymer pastes do not achieve the low electrical resistances that can be achieved by a firing process, they may be sufficient for some applications.

The base metal buss bars described herein may alternatively be applied by thin-film deposition processes onto the fired conductive fingers. The base metal buss bars may also be applied by plating, extrusion, inkjet, sputtering, evaporation, multiple printing or other processes. The base metal paste may also be used as a solderable back tab electrode and may be applied over the previously fired aluminum immediately prior or after the paste forming the front buss bars is printed. Other silicon cell substrate configurations may also be used, such as n-base cells with p-type emitters.

What is claimed is:

1. A photovoltaic cell comprising:
    (a) a semiconductor substrate having a front surface;
    (b) one or more anti-reflection coating layers on the front surface of said semiconductor substrate;
    (c) a plurality of silver-containing fingers in contact with the one or more anti-reflection coating layers and in electrical contact with the semiconductor substrate; and
    (d) one or more buss bars each in contact with the one or more anti-reflection coating layers and the silver-containing fingers and each not in electrical contact with the semiconductor substrate, said buss bars containing a base metal selected from one or more of copper, nickel, lead, tin, iron, indium, zinc, bismuth and cobalt, wherein at least 80 wt % of the metal in the buss bars is a base metal.

2. The photovoltaic cell of claim 1 wherein the base metal in said buss bars comprises copper.

3. The photovoltaic cell of claim 1 wherein at least 95 wt % of the metal in the buss bars is a base metal.

4. The photovoltaic cell of claim 1, wherein the photovoltaic cell is a solar cell.

* * * * *